(12) United States Patent
Majumdar et al.

(10) Patent No.: US 8,685,847 B2
(45) Date of Patent: Apr. 1, 2014

(54) SEMICONDUCTOR DEVICE HAVING LOCALIZED EXTREMELY THIN SILICON ON INSULATOR CHANNEL REGION

(75) Inventors: Amlan Majumdar, White Plains, NY (US); Robert J. Miller, Yorktown Heights, NY (US); Muralidhar Ramachandran, Mahopac, NY (US)

(73) Assignees: International Business Machines Corporation, Armonk, NY (US); Advanced Micro Devices Corporation, Sunnyvale, CA (US); Freescale Semiconductor Corporation, Austin, TX (US)

( * ) Notice: Subject to any disclaimer, the term of this patent is extended or adjusted under 35 U.S.C. 154(b) by 528 days.

(21) Appl. No.: 12/912,897

(22) Filed: Oct. 27, 2010

(65) Prior Publication Data

US 2012/0104498 A1 May 3, 2012

(51) Int. Cl.
*H01L 21/425* (2006.01)
(52) U.S. Cl.
USPC ............ 438/517; 438/300; 438/297; 257/347
(58) Field of Classification Search
USPC ......... 257/351, 349, 202, 204, 341, 288, 347, 257/481, 344, 350, 335, 369, 382, 410, 412, 257/900, 190, 19, 192, 92, 337, 338, 510, 257/647, 9; 438/154, 151, 300, 163, 149, 438/297, 225, 478, 199, 222, 299, 307, 479, 438/303, 938, 242, 517, 197, 289, 954
See application file for complete search history.

(56) References Cited

U.S. PATENT DOCUMENTS

| | | | |
|---|---|---|---|
| 7,176,481 B2 | 2/2007 | Chen et al. | |
| 7,358,551 B2 | 4/2008 | Chidambarrao et al. | |
| 7,368,358 B2 | 5/2008 | Ouyang et al. | |
| 7,479,431 B2 | 1/2009 | Hattendorf et al. | |
| 7,572,712 B2 | 8/2009 | Chong et al. | |
| 7,648,868 B2 | 1/2010 | Majumdar et al. | |
| 7,652,332 B2 | 1/2010 | Cartier et al. | |
| 7,719,062 B2 | 5/2010 | Fischer et al. | |
| 2003/0211681 A1* | 11/2003 | Hanafi et al. | 438/200 |

(Continued)

OTHER PUBLICATIONS

R. Huang et al., "Challenges of 22 nm and Beyond CMOS Technology," Science in China Series F: Information Sciences, vol. 52, No. 9, pp. 1491-1533, Sep. 2009.

(Continued)

*Primary Examiner* — Thanh Y Tran
(74) *Attorney, Agent, or Firm* — Cantor Colburn LLP; Vazken Alexanian

(57) ABSTRACT

A method of forming a transistor device includes forming a dummy gate stack structure over an SOI starting substrate, comprising a bulk layer, a global BOX layer over the bulk layer, and an SOI layer over the global BOX layer. Self-aligned trenches are formed completely through portions of the SOI layer and the global BOX layer at source and drain regions. Silicon is epitaxially regrown in the source and drain regions, with a local BOX layer re-established in the epitaxially regrown silicon, adjacent to the global BOX layer. A top surface of the local BOX layer is below a top surface of the global BOX layer. Embedded source and drain stressors are formed in the source and drain regions, adjacent a channel region. Silicide contacts are formed on the source and drain regions. The dummy gate stack structure is removed, and a final gate stack structure is formed.

20 Claims, 9 Drawing Sheets

(56) References Cited

U.S. PATENT DOCUMENTS

2006/0084235 A1* 4/2006 Barr et al. .................... 438/300
2009/0039426 A1* 2/2009 Cartier et al. ................ 257/344
2009/0242936 A1 10/2009 Cheng et al.

OTHER PUBLICATIONS

M. Lee et al., "Strined Si, SiGe, and Ge Channels for High-Mobility Metal-Oxide-Semiconductor field-Effect Transistors," Journal of Applied Physics, vol. 97, 011101, 2005.

* cited by examiner

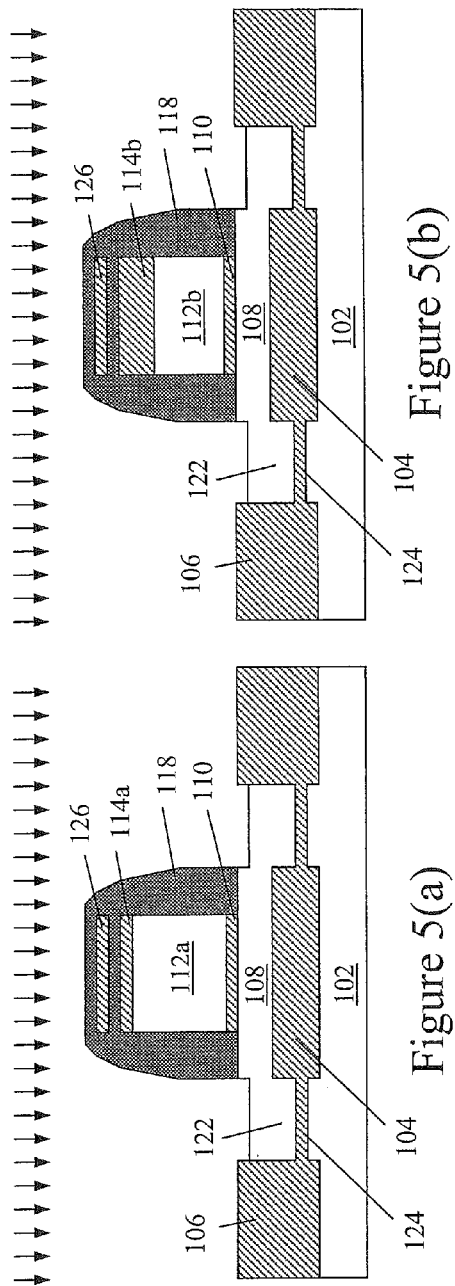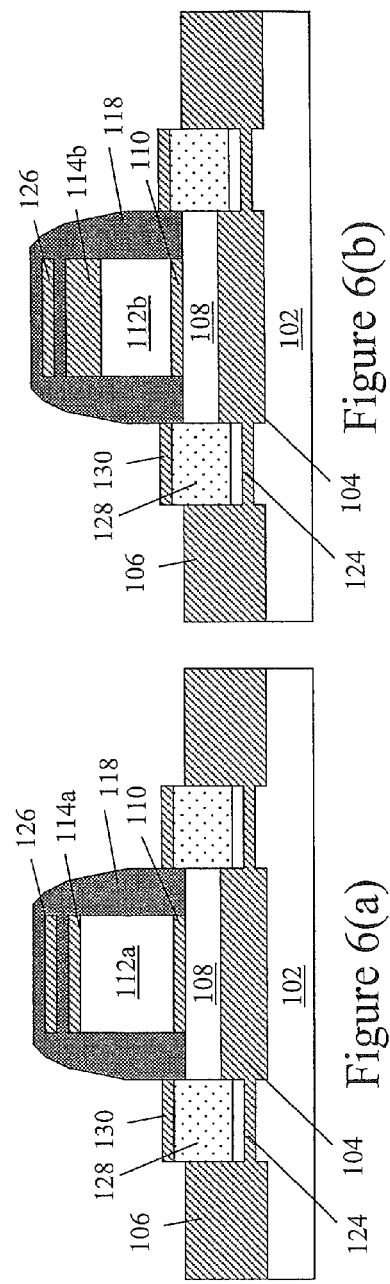

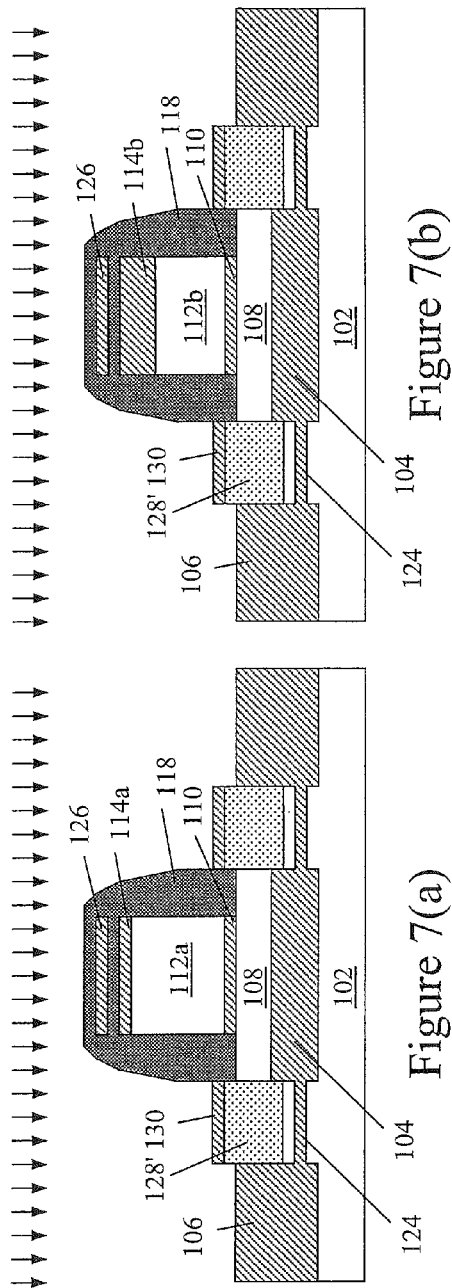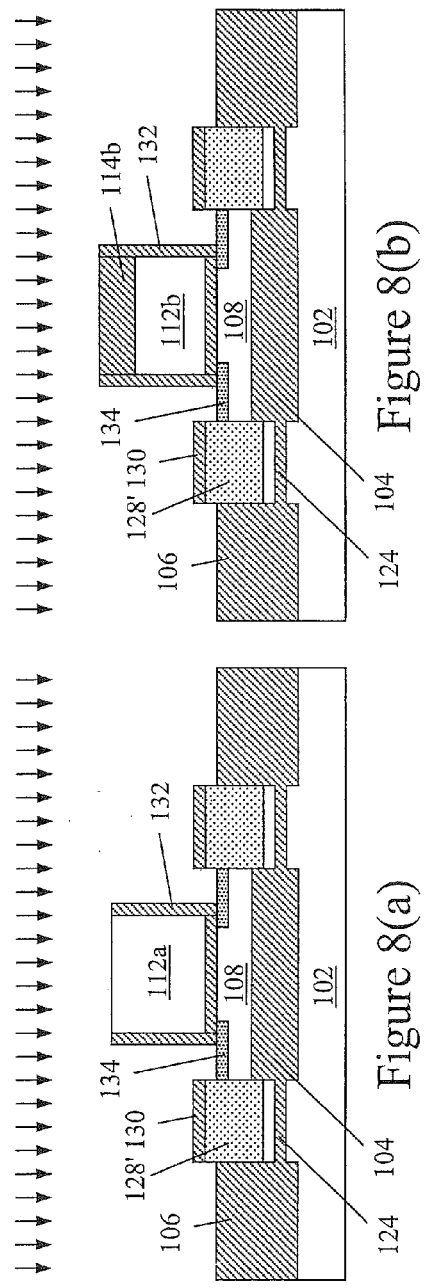
Figure 7(a) Figure 7(b) Figure 8(a) Figure 8(b)

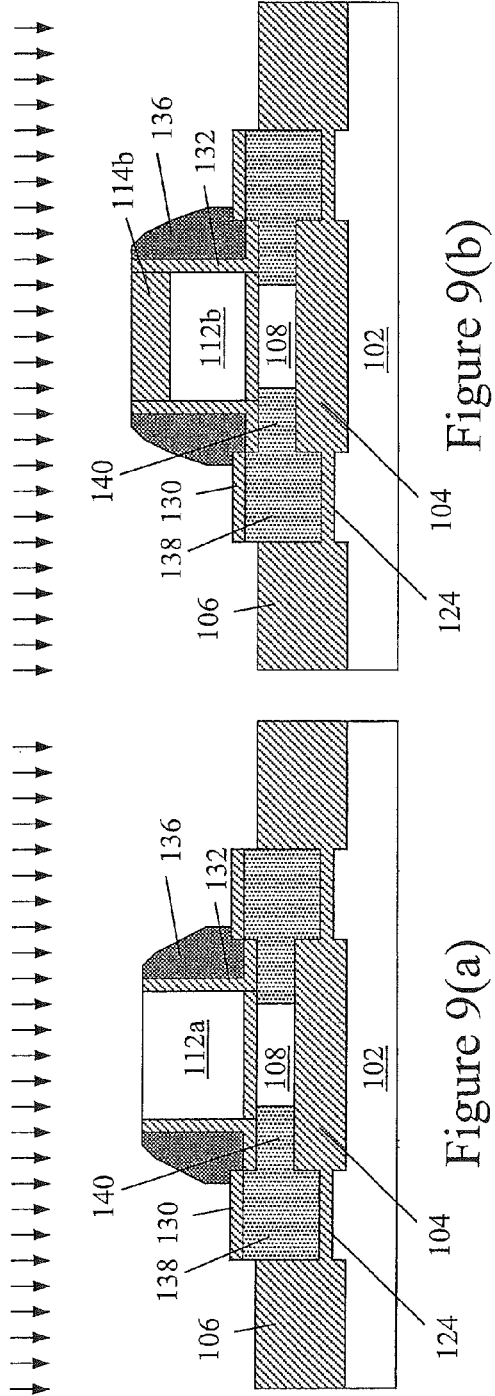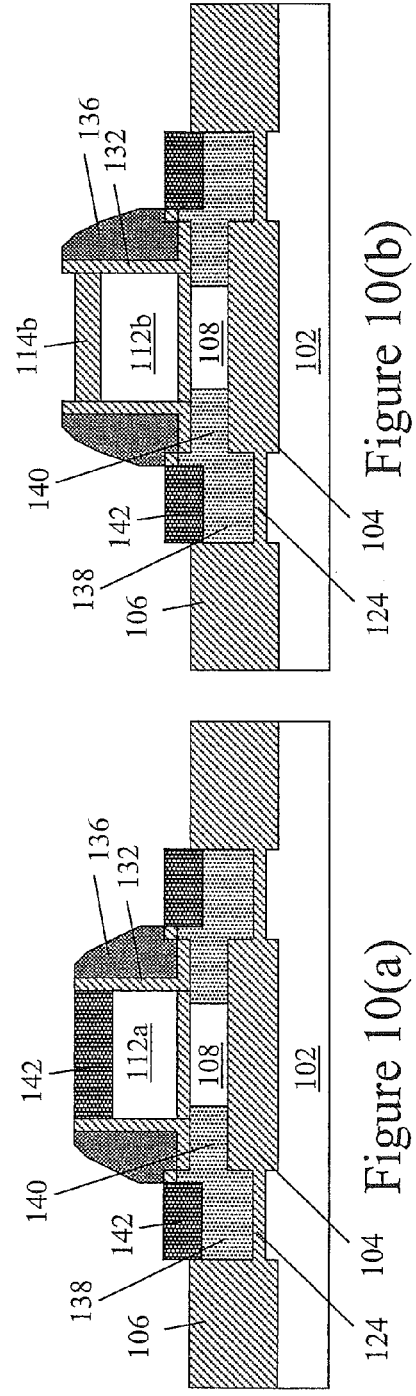

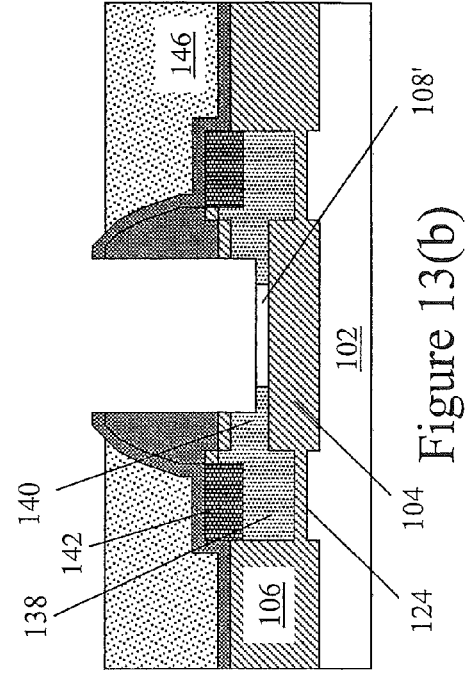
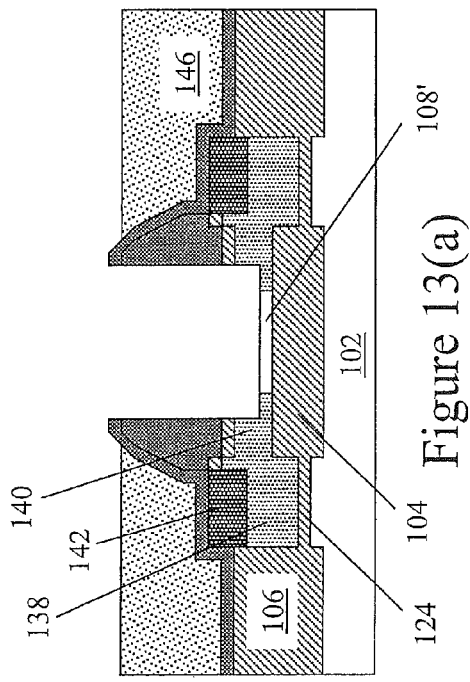
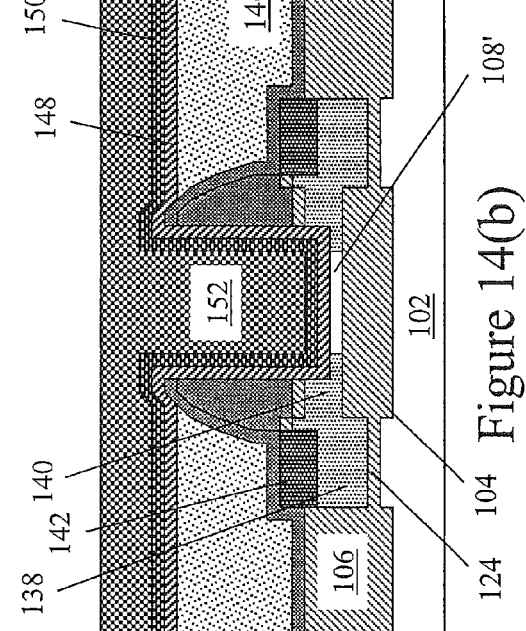
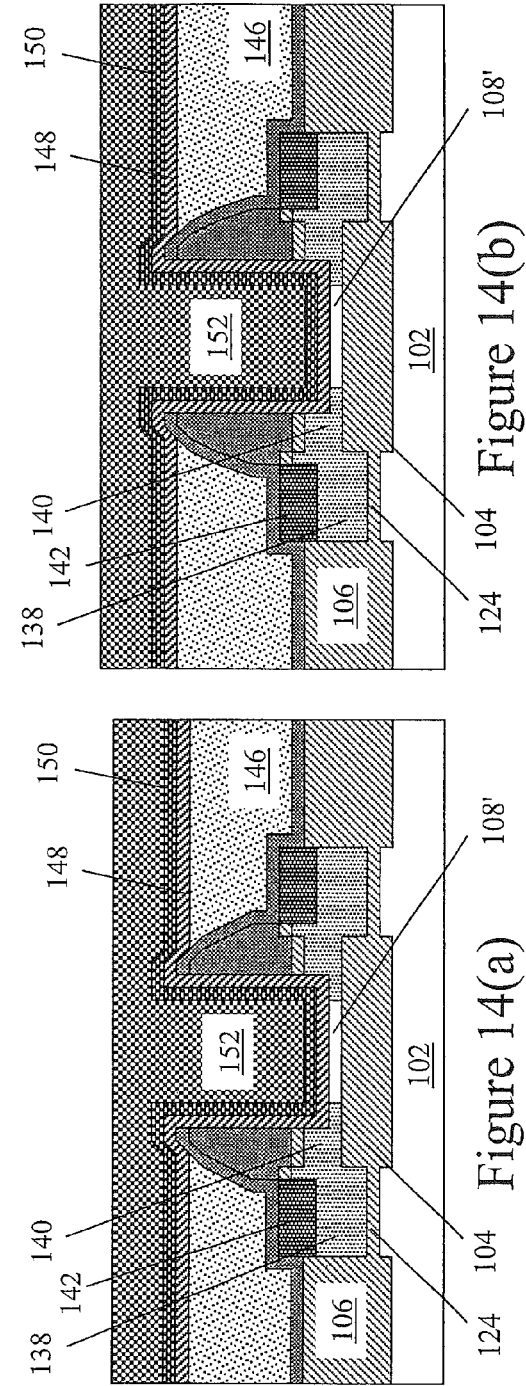

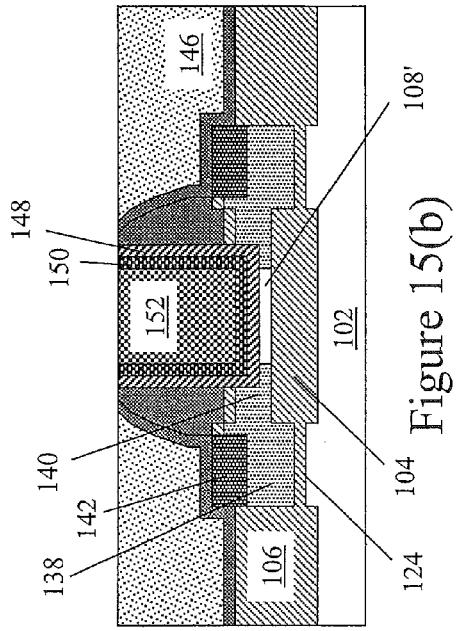
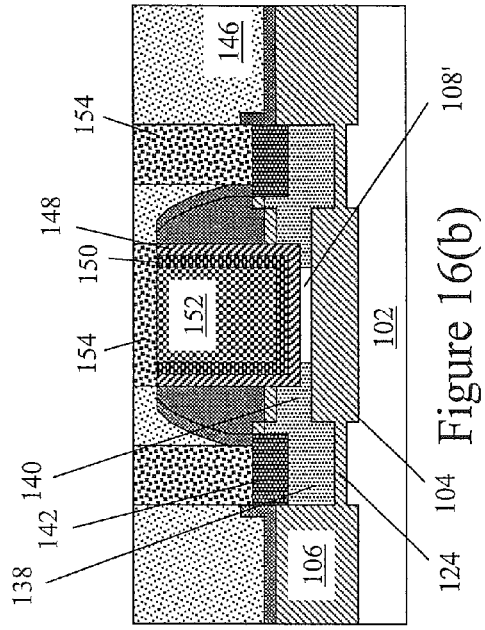
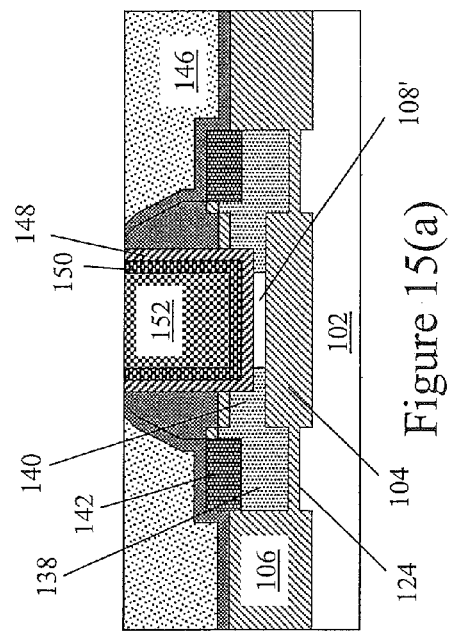
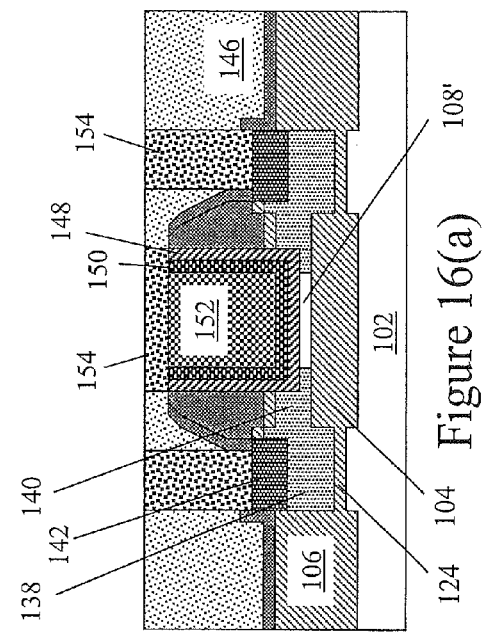
Figure 15(a)        Figure 15(b)
Figure 16(a)        Figure 16(b)

SEMICONDUCTOR DEVICE HAVING LOCALIZED EXTREMELY THIN SILICON ON INSULATOR CHANNEL REGION

BACKGROUND

The present invention relates generally to semiconductor device manufacturing and, more particularly, to a semiconductor device having a localized, extremely thin silicon-on-insulator channel region.

Semiconductor-on-insulator (SOI) devices, such as silicon-on-insulator devices (also abbreviated SOI in the art), offer several advantages over more conventional semiconductor devices. For example, SOI devices may have lower power consumption requirements than other types of devices that perform similar tasks. SOI devices may also have lower parasitic capacitances than non-SOI devices. This translates into faster switching times for the resulting circuits. In addition, the phenomenon of latchup, which is often exhibited by complementary metal-oxide semiconductor (CMOS) devices, may be avoided when circuit devices are manufactured using SOI fabrication processes. SOI devices are also less susceptible to the adverse effects of ionizing radiation and, therefore, tend to be more reliable in applications where ionizing radiation may cause operation errors.

The gain of a MOS transistor, usually defined by the transconductance ($g_m$), is proportional to the mobility ($\mu$) of the majority carrier in the transistor channel. The current carrying capability, and hence the performance of an MOS transistor is proportional to the mobility of the current-carrying carrier in the channel. The mobility of holes, which are the current-carrying carriers in a P-channel field effect (PFET) transistor, and the mobility of electrons, which are the current-carrying carriers in an N-channel field effect (NFET) transistor, may be enhanced by applying an appropriate stress to the channel. Existing stress engineering methods greatly enhance circuit performance by increasing device drive current without increasing device size and device capacitance. For example, a tensile stress liner and/or an embedded SiC source/drain region applied to an NFET transistor induces a longitudinal tensile stress in the channel and enhances the electron mobility, while a compressive stress liner and/or an embedded SiGe source/drain region applied to a PFET transistor induces a longitudinal compressive stress in the channel and enhances the hole mobility.

There are several process integration methods for the creation of dual stress films. The underlying theme is the blanket deposition of a first stress layer type, followed by lithography to mask and protect this first stress layer type, an etch to remove the first stress layer type where it is not desired, and then deposition of the second stress layer type. The resulting enhanced carrier mobility, in turn, leads to higher drive currents and therefore higher circuit level performance.

Ultrathin body silicon MOSFETs, such as ETSOI (extremely thin SOI) or FinFETs, are considered viable options for CMOS scaling for the 22 nanometer (nm) node and beyond. However, a thin-body SOI transistor such as an ETSOI transistor needs epitaxially grown, raised source/drain regions to achieve a sufficiently low transistor series resistance. Moreover, due to the extreme thinness of the ETSOI layer (e.g., on the order of about 6 nm or less), conventionally formed embedded source/drain stressors are not a viable means of inducing channel stress, as the trenches used to form embedded stressors are about 60-80 nm deep into the SOI layer. Consequently, it is a significant challenge to incorporate conventional stress layer techniques into such ultrathin film devices.

SUMMARY

In one aspect, a method of forming a transistor device includes forming a dummy gate stack structure over a silicon-on-insulator (SOI) starting substrate, the SOI substrate comprising a bulk layer, a global BOX layer over the bulk layer, and an SOI layer over the global BOX layer, the SOI layer having an initial thickness; forming self-aligned trenches completely through portions of the SOI layer and the global BOX layer at locations corresponding to source and drain regions; epitaxially regrowing silicon in the source and drain regions; re-establishing a local BOX layer in the epitaxially regrown silicon, adjacent to the global BOX layer, wherein a top surface of the local BOX layer is below a top surface of the global BOX layer; forming embedded source and drain stressors in the source and drain regions, adjacent a portion of the SOI layer corresponding to a channel region; forming silicide contacts on the source and drain regions; removing the dummy gate stack structure; and forming a final gate stack structure.

In another aspect, a method of forming a transistor device includes forming a dummy gate stack structure over a silicon-on-insulator (SOI) starting substrate, the SOI substrate comprising a bulk layer, a global BOX layer over the bulk layer, and an SOI layer over the global BOX layer, the SOI layer having an initial thickness; forming disposable spacers on sidewalls of the dummy gate stack structure; forming self-aligned trenches completely through portions of the SOI layer and the global BOX layer at locations corresponding to source and drain regions; epitaxially regrowing silicon in the source and drain regions; re-establishing a local BOX layer in the epitaxially regrown silicon, adjacent to the global BOX layer, wherein a top surface of the local BOX layer is below a top surface of the global BOX layer; forming embedded source and drain stressors in the source and drain regions, adjacent a portion of the SOI layer corresponding to a channel region; performing, with the disposable spacers in place, a first dopant implant to establish lightly doped source/drain regions; removing the disposable spacers and performing a second dopant implant to form source/drain extension regions; forming final sidewall spacers and performing a third dopant implant to establish deep source/drain regions, and annealing to drive the implanted dopant materials; forming silicide contacts on the source/drain regions; removing the dummy gate stack structure; thinning the SOI layer from the original thickness to a final thickness; and forming a final gate stack structure.

In another aspect, a transistor device includes a buried oxide (BOX) layer formed over a bulk substrate, the BOX layer including a first portion disposed beneath a channel region and source/drain extension regions, and a second portion disposed beneath source/drain regions, wherein a top surface of the second portion of the BOX layer is below a top surface of the first portion of the BOX layer such that the second portion is recessed with respect to the first portion; a thin, silicon-on-insulator (SOI) layer disposed over the first portion of the BOX layer, corresponding to the channel region; the source drain regions including embedded source/drain regions abutting the top surface of the second portion of the BOX layer, the embedded source/drain regions comprising a semiconductor material that provides a stress on the channel region; the source/drain extension regions having a thickness greater than the thin SOI layer of the channel region; and a gate stack disposed over the channel region.

BRIEF DESCRIPTION OF THE SEVERAL VIEWS OF THE DRAWINGS

Referring to the exemplary drawings wherein like elements are numbered alike in the several Figures:

FIGS. 1(a) through 16(a) and FIGS. 1(b) through 16(b) are cross sectional views of, respectively, first and second exemplary embodiments of a method of forming a semiconductor device having a localized, extremely thin silicon-on-insulator (ETSOI) channel region, in which:

FIG. 1(a) is a starting SOI structure used in the first embodiment;

FIG. 1(b) is a starting SOI structure used in the second embodiment;

FIG. 5(a) illustrates formation of a local BOX layer beneath the Si epi S/D regions according to the first embodiment;

FIG. 5(b) illustrates formation of a local BOX layer beneath the Si epi S/D regions according to the second embodiment;

FIG. 6(a) illustrates the formation of embedded source/drain stressor regions according to the first embodiment;

FIG. 6(b) illustrates the formation of embedded source/drain stressor regions according to the second embodiment;

FIG. 7(a) illustrates doping of the embedded S/D regions according to the first embodiment;

FIG. 7(b) illustrates doping of the embedded S/D regions according to the second embodiment;

FIG. 8(a) illustrates doping of the S/D extension regions according to the first embodiment;

FIG. 8(b) illustrates doping of the S/D extension regions according to the second embodiment;

FIG. 9(a) illustrates doping of deep S/D regions and activation of the implants by annealing according to the first embodiment;

FIG. 9(b) illustrates doping of deep S/D regions and activation of the implants by annealing according to the second embodiment;

FIG. 10(a) illustrates the formation of a self-aligned silicide contact over the deep S/D regions according to the first embodiment;

FIG. 10(b) illustrates the formation of a self-aligned silicide contact over the deep S/D regions according to the second embodiment;

FIG. 13(a) illustrates local thinning of the channel region from the original UTSOI thickness to the desired ETSOI thickness according to the first embodiment;

FIG. 13(b) illustrates local thinning of the channel region from the original UTSOI thickness to the desired ETSOI thickness according to the second embodiment;

FIG. 14(a) illustrates formation of a gate stack structure according to the first embodiment;

FIG. 14(b) illustrates formation of a gate stack structure according to the second embodiment;

FIG. 15(a) illustrates planarization of the gate stack structure according to the first embodiment;

FIG. 15(b) illustrates planarization of the gate stack structure according to the second embodiment;

FIG. 16(a) illustrates contact area (CA) formation according to the first embodiment;

FIG. 16(b) illustrates contact area (CA) formation according to the second embodiment.

DETAILED DESCRIPTION

Figure 1A:
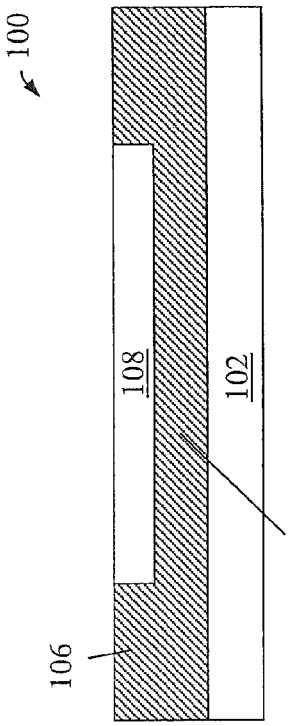

Disclosed herein is a deep source and drain structure, and exemplary methods of forming the same, for strong stressor effect and low parasitic resistance, coupled with an extremely thin silicon-on-insulator (ETSOI) channel for optimal control of short channel effects.

As indicated above, ETSOI devices have already been shown to provide improved electrostatics (i.e., better short channel effects). However, two main limitations in ETSOI structures are a high series resistance and a limited ability to apply stress through embedded stressors. The high series resistance arises from a combination of the need to limit dopant dose and diffusion, loss of dopant to the close-proximity underlying buried oxide/insulator (BOX) layer, and the naturally high sheet resistance ($R_s$) of a thin layer, for a given resistivity ($\rho$).

Although raised source/drain (RSD) structures can thicken the source/drain regions, they can also cause increased parasitic capacitance since they electrostatically couple the source or drain to the gate. Such a raised structure is also less effective as an "embedded" stressor, and its height interferes with the effectiveness of overlayer stressors (for example, data shown in D. V. Singh, J. M. Hergenrother, J. W. Sleight, Z. Ren, H. Nayfeh, O. Dokumaci, L. Black, D. Chidambarrao, R. Venigalla, J. Pan, B. L. Tessier, A. Nomura, J. A. Ott, M. Khare, K. W. Guarini, M. Ieong, and W. Haensch, "Effect of Contact Liner Stress in High-Performance FDSOI Devices with Ultra-Thin Silicon Channels and 30 nm Gate Lengths", Proceedings of IEEE SOI Conference, pp. 178-179, 2005). Accordingly, the embodiments herein avoid having the source (S) or drain (D) raised by introducing a practical means of lowering these regions into a recessed area of the BOX insulator.

As shown in further detail below, the transistor structure is achieved by a process sequence that begins with an ultra thin SOI (UTSOI) semiconductor layer rather than an ETSOI layer (where "UTSOI" is understood in the art as being thicker than "ETSOI"). This keeps the UTSOI protected through several etching and cleaning operations, in a self-aligned manner, during local etching through the BOX layer, followed by epitaxial regrowth of a single crystal silicon layer (for source and drain). The BOX layer is then reestablished, via separation by implantation of oxygen (SIMOX) locally beneath the source and drain, thus forming an insulator whose top surface is lower than the pre-existing original (global) BOX layer. Subsequently, a portion of the source and drain region is etched to make way for epitaxially grown stressors (e.g., SiGe or SiC, depending on device polarity) that are thick enough to provide strong stress and low resistivity without the need to be formed higher than the initial wafer plane. The structure also makes use of a dummy gate to create either a polysilicon/oxynitride gated transistor or a metal gate/high-k dielectric transistor with silicided, heavily doped source and drain.

As a result, a novel ETSOI transistor device includes extension and source/drain regions that are thicker than the ETSOI channel, thereby providing improvement of parasitic resistance. In particular, the single-crystal semiconductor S/D regions are thicker than the ETSOI channel by virtue of extending below the silicon surface rather than by predominantly rising above the surface. In so doing, these regions may impose beneficial stress on the channel, in a manner that is more effective than stress obtained from conventionally raised S/D regions. The BOX layer, despite its greater height below the channel region versus below the S/D and extension regions, is continuous in the transistor region. In addition, the use of replacement gate process methodology enables the formation of a local BOX and thinning of the SOI locally in the channel region, with high thickness control and uniformity.

In the following description, reference is made simultaneously to the embodiments of the "Figure (a)" process flow and the "Figure (b)" process flow in the sequence of figures, so that the similarities and differences between the embodiments may be more easily illustrated. As described herein, the Figure (a) series depicts a first process flow embodiment and the Figure (b) series depicts a second process flow embodiment where like reference numerals depict like structures in the figures.

Figure 1B:
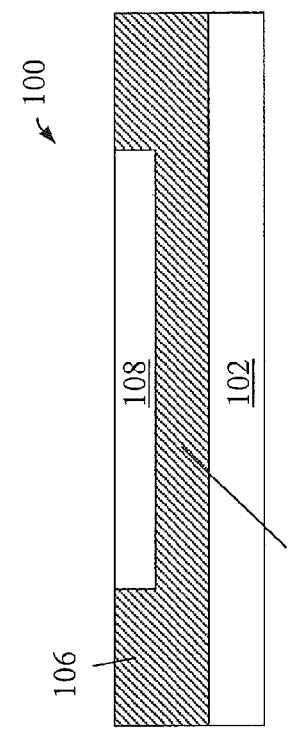

Referring initially to FIG. 1(a) and FIG. 1(b), a starting structure 100 includes a bulk substrate 102 (e.g., silicon) and a buried oxide (BOX) layer 104 formed on the bulk substrate 102. Additional insulating regions between an active area include shallow trench isolation (STI) regions 106 (e.g., oxide), between which is defined an active area wherein a silicon-on-insulator (SOI) layer 108 is formed over the BOX layer 104. As indicated above, the SOI layer 108 is initially fabricated as a UTSOI layer having an initial thickness on the order of about 10 nanometers (nm) to about 30 nm, although additional thickness ranges are also contemplated. Exemplary processing steps in forming the starting structure 100 in FIGS. 1(a) and 1(b) may include pad oxidation, pad nitride deposition, active area lithography and reactive-ion etch (RIE), resist strip, STI oxide deposition, STI oxide chemical mechanical planarization (CMP), and pad nitride and pad oxide removal.

It will be noted that the channel region portion of the SOI layer 108 will be eventually thinned down further to ETSOI thickness during replacement gate processing. The target thickness of the initial SOI layer 108 reflects a desired thickness of the extension regions of the final structure.

Figure 2A:
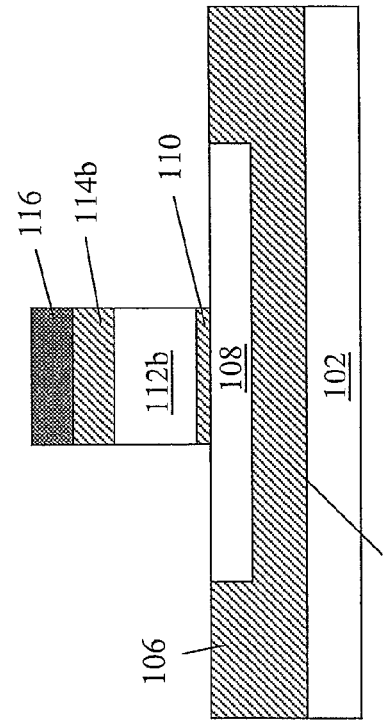
FIG. 2(a) illustrates the formation of a dummy gate stack structure according to the first embodiment.
Figure 2B:
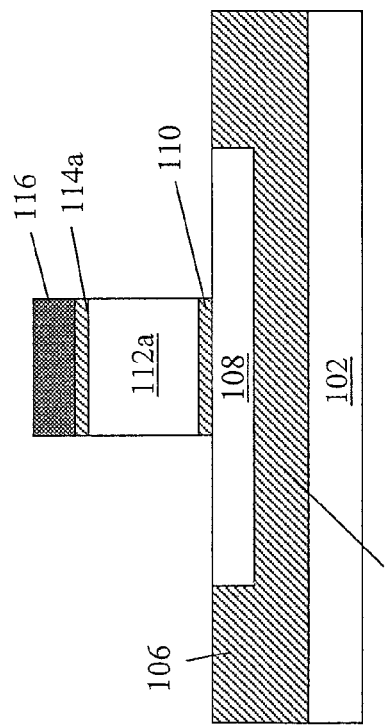
FIG. 2(b) illustrates the formation of a dummy gate stack structure according to the second embodiment.

FIGS. 2(a) and 2(b) illustrate, respectively, a dummy gate stack formation for the first and second embodiments. The dummy gate stack includes a dummy gate oxide 110 for both embodiments, a dummy polysilicon 112a/112b for both embodiments, a poly screen oxide 114a for the first embodiment or a poly oxide cap 114b for the second embodiment, and a silicon nitride (SiN) cap layer 116 for both embodiments. The dummy gate stacks are formed using dummy gate oxidation, dummy poly deposition, poly screen oxidation or poly oxide cap deposition, SiN deposition, gate lithography and RIE, and resist strip. Here, the dummy poly remains undoped since the entire dummy gate stack sees the thermal budget of a subsequent SIMOX process. With respect to the second embodiment of FIG. 2(b), the poly oxide cap 114b (e.g., about 10-50 nm) is thicker than the thin oxide cap 114a (e.g., about 2-4 nm) in the first embodiment of FIG. 2(a). As is seen later, the thick oxide cap 114b will prevent subsequent silicidation of the dummy poly 112b, which in turn will make the removal (etch out) of the dummy gate stack easier in the process flow.

Figure 3A:
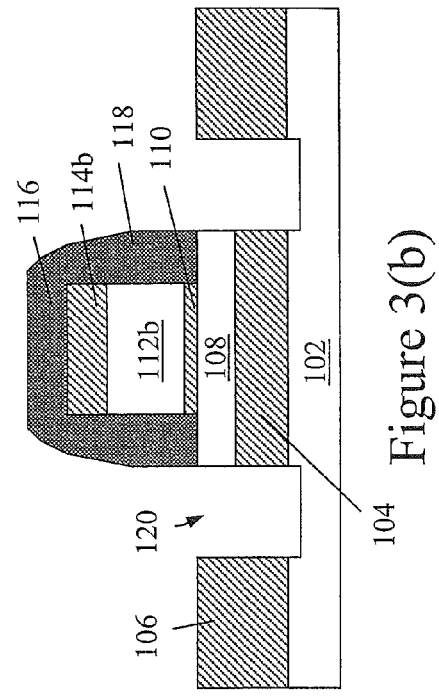
FIG. 3(a) illustrates self-aligned trench formation according to the first embodiment.
Figure 3B:
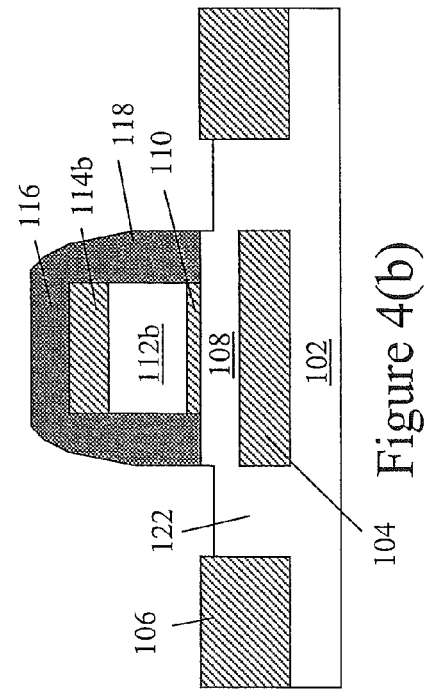
FIG. 3(b) illustrates self-aligned trench formation according to the second embodiment.

FIGS. 3(a) and 3(b) illustrate self-aligned trench formation for each embodiment, where a disposable nitride spacer 118 is formed on sidewalls of the dummy gate stack structure such as by nitride deposition followed by nitride RIE. Using the nitride cap 116 and disposable spacer 118, self-aligned trenches 120 are etched using a silicon (Si) RIE and an oxide RIE. The oxide RIE etches entirely through the exposed BOX region 104, stopping within the bulk substrate 102. Thus, the portion of the BOX region 104 that was protected from etching is self-aligned with the combination of the gate stack and spacers 118.

Figure 4A:
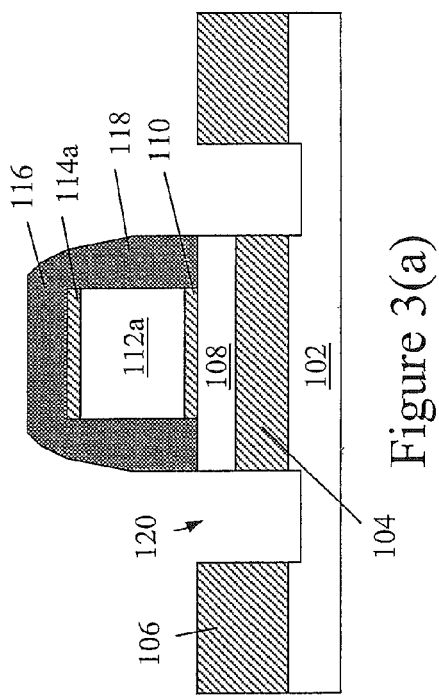
FIG. 4(a) illustrates epitaxial growth of silicon in the source/drain regions according to the first embodiment.
Figure 4B:
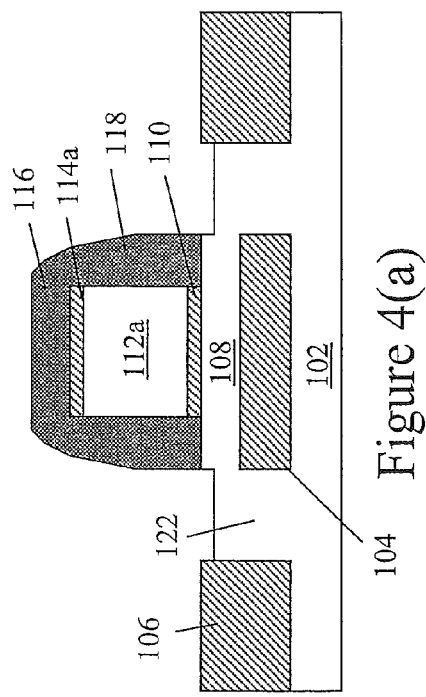
FIG. 4(b) illustrates epitaxial growth of silicon in the source/drain regions according to the second embodiment.

Proceeding to FIGS. 4(a) and 4(b), an epitaxial growth process is performed using the Si of the exposed substrate 102 as the template, thereby forming epitaxial Si regions 122. The amount of Si to be deposited is based on competing factors. On the one hand, a relatively thin epitaxial Si layer potentially provides better control over subsequent processing parameters such as uniformity, lower oxygen implant energy, less straggle, and less need for an increased height of the dummy gate. On the other hand, if the epitaxially grown Si regions 122 are too thin, such a condition could lead to insufficient "good" Si (i.e., with low oxygen content) above the new BOX to be amenable to a later formed stressor epitaxial region.

FIGS. 5(a) and 5(b) illustrate the formation of a local recessed BOX layer 124 corresponding to the locations where the original portions of the BOX layer 104 were removed. This is performed by oxygen ion implantation or SIMOX as indicated by the arrows in the figures. It will be noted that the SOI channel region 108 (still at a UTSOI thickness range) is protected from receiving any oxygen implant since it is covered by the nitride cap, dummy gate stack and spacers. Instead, a portion 126 of the thick nitride cap may be converted to an oxynitride. It should also be noted that any residual oxygen present in the top of the Si epitaxial regions 122 as a result of the SIMOX process will be removed to make way for a subsequent epitaxial stress layer process.

Following the oxygen ion implantation, the wafer is then annealed to form the local BOX layer 124 beneath the Si epi S/D regions 122, as shown in FIGS. 5(a) and 5(b). In order to obtain the desired stressor benefits, the oxygen implant conditions should be selected such that the top of the local BOX layer 124 is below the top of the original BOX layer 104. However, there is no similar constraint that the bottom of the local BOX layer 124 be shallower than the bottom of the original BOX layer 104, although it may be as shown in the figures.

Referring now to FIGS. 6(a) and 6(b), the formation of embedded source/drain stressor regions is illustrated. Once again, the disposable (sacrificial) nitride spacers 118 surrounding the gate stack are used to protect the channel region while the Si S/D regions 122 are recessed using Si RIE, leaving a layer of template Si above the local BOX layer 124. A silicon containing, embedded S/D stressor 128 is then epitaxially regrown in the recessed trench followed by low-temperature oxidation to form an oxide cap 130. The oxide cap 130 will protect the doped S/D regions from hot phosphorus exposure during a disposable spacer removal that is performed later in the process flow. The top surface of the epitaxially re-grown S/D regions 128 at least reaches the original Si surface, and optionally may be slightly raised above it. Generally, the re-grown S/D regions 128 are of the composition $SiX$, depending on the direction of the desired stress. The embedded stressor, for example, may be silicon carbide (SiC) for NFETs and silicon germanium (SiGe) for PFETs. At this stage, lithography and ion implantation may also be used to dope the embedded S/D regions 128 at this stage using the disposable nitride spacers 118 as implant spacers, as shown in FIGS. 7(a) and 7(b). The doped, embedded stressor S/D regions are designated by 128' in FIGS. 7(a) and 7(b).

Then, as shown in FIGS. 8(a) and 8(b), the nitride spacers and the nitride cap atop the gate stack are then removed using wet etchant, such as, hot phosphoric acid. Again, doped S/D regions 128' are protected from hot phosphoric acid by the oxide cap 130. The nitride removal is followed by the formation of an offset extension spacer 132 on sidewalls of the dummy polysilicon 112a, 112b using oxide deposition and oxide RIE. Here, it will be noted that in the first embodiment of FIG. 8(a), the oxide RIE removes the thin poly screen oxide 114a to expose the dummy polysilicon 112a. In contrast, the thicker oxide cap 114b remains on the dummy polysilicon 112b in the second embodiment of FIG. 8(b). With the offset extension spacers 132 in place, another ion implantation process is used to dope the S/D extension regions 134.

In FIGS. 9(a) and 9(b), a final nitride spacer 136 is then formed using oxide liner deposition, nitride deposition and nitride RIE with the nitride RIE stopping on the oxide liner. Deep S/D regions 138 are doped to higher doping levels using lithography and ion implantation. Subsequently, all implants are activated and diffused using a spike rapid thermal anneal (RTA), resulting in a link-up between the diffused S/D extension regions 140 and channel, as well as between the diffused S/D extension regions 140 and the deep S/D regions 138. Moreover, this anneal also ensures that the deep S/D regions are butted against the top of the recessed local BOX layer 124 underneath it, thereby eliminating deep S/D-to-body junction capacitance.

FIGS. 10(a) and 10(b) illustrate the formation of a self-aligned silicide contact 142 over the deep S/D regions using the final spacer 136. As known in the art, a silicide process involves precleans for removing oxide, refractory metal deposition, silicide formation anneal, and selective etch of unreacted metal atop insulation regions (e.g., STI oxide and spacer nitride). The selective metal etch can performed, for example, using aqua regia. In the first embodiment of FIG. 10(a), the dummy gate poly 112a is also silicided, whereas in the second embodiment of FIG. 10(b), the oxide cap 114b prevents the formation of silicide contact material 142 on the dummy gate poly 112b. It will also be noted that in FIG. 10(b), there will be some oxide cap loss due to silicide preclean operations. However, there will still be enough oxide left to prevent silicidation of the dummy gate poly 112b.

Figure 11A:
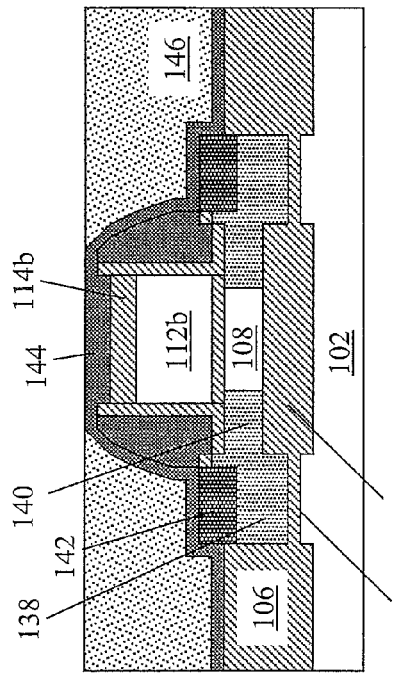
FIG. 11(a) illustrates the formation of a barrier nitride layer and inter-layer dielectric (ILD) oxide according to the first embodiment.
Figure 11B:
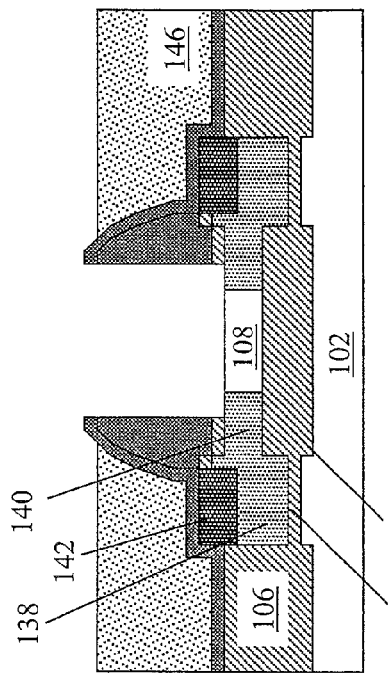
FIG. 11(b) illustrates the formation of a barrier nitride layer and inter-layer dielectric (ILD) oxide according to the second embodiment.
Figure 12A:
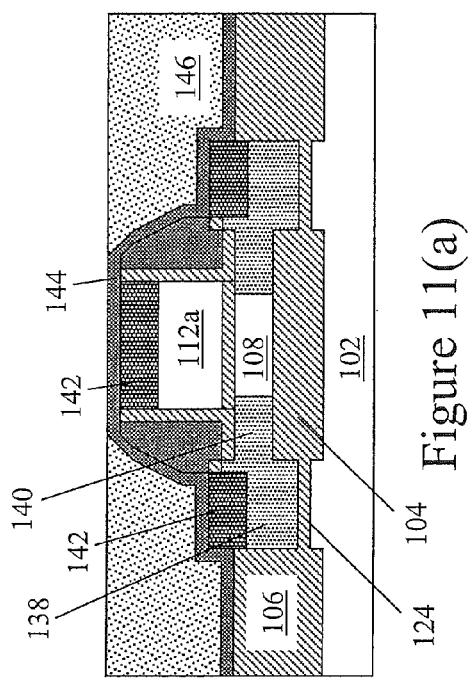
FIG. 12(a) illustrates the removal of the dummy gate stack according to the first embodiment.
Figure 12B:
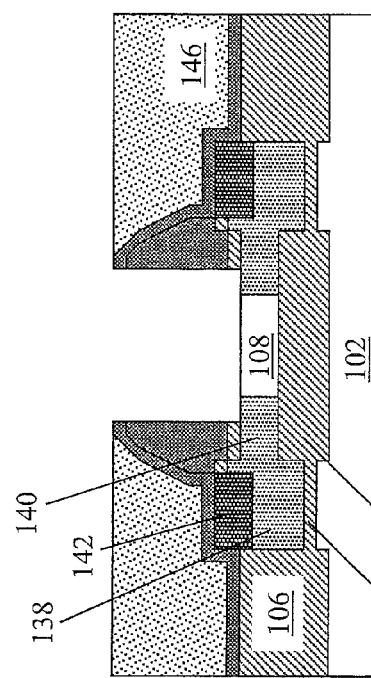
FIG. 12(b) illustrates the removal of the dummy gate stack according to the second embodiment.

Once the deep S/D silicide contacts are formed, the dummy gate stack can now be removed. In order to remove the dummy gate stack, a barrier nitride layer 144 and inter-layer dielectric (ILD) oxide 146 are deposited. Following the deposition, a CMP operation planarizes the ILD oxide 146 down to the barrier nitride 144 atop the dummy gate structure, as shown in FIGS. 11(a) and 11(b). A series of etching steps is employed to remove the entire dummy gate stack. In the first embodiment, the dummy gate stack is removed using a nitride RIE, a silicide etch, a dummy poly etch (e.g., TMAH), and a dummy oxide etch to result in the structure of FIG. 12(a). In the second embodiment, the dummy gate stack is removed using a nitride RIE, an oxide etch, a dummy poly etch (e.g., TMAH), and a dummy oxide etch to result in the structure of FIG. 12(b).

With the exception of the last dummy oxide in the first embodiment and both poly oxide etch and dummy oxide etch in the second embodiment, the remaining etches are selective to oxide and do not result in any oxide recess. Since the dummy oxide is very thin, this etch will not result in any significant recess of the ILD oxide layer 146. In the second embodiment of FIG. 12(b), the poly oxide cap removal will result in some recessing of the ILD oxide layer 146.

At this point the exposed channel SOI region 108 is now further thinned down from the original UTSOI thickness to the desired ETSOI thickness using oxidation and HF oxide etch, as shown in FIGS. 13(a) and 13(b), thereby defining an ETSOI channel region 108'. In an exemplary embodiment, a low-temperature oxidation, such as plasma-assisted, slot plane antenna (SPA) oxidation, is performed to minimize the thermal budget in order to avoid unwanted additional dopant diffusion. This oxidation thinning to the target ETSOI channel thickness may be done with a high level of thickness control and uniformity. It is noted that the HF oxide removal step will recess the ILD oxide layer 146, as shown in both FIGS. 13(a) and 13(b).

Upon achieving the desired ETSOI channel thickness, the device is prepared for actual gate stack formation. In this regard, different options are contemplated. For example, the gate stack structure could include a SiON/polysilicon gate stack or a high-K/metal gate stack, among others. In the remaining figures described herein, the illustrated embodiments utilize a high-K/metal gate stack. Referring to FIGS. 14(a) and 14(b), the gate stack structure is formed by deposition of a high-K gate dielectric layer 148, a workfunction setting metal gate (MG1) layer 150, and a metal gate (MG2) fill layer 152. The MG2 layer is then planarized by CMP, after which portions of both MG1 and MG2 might be left atop the recessed ILD oxide regions 146. In this instance, a touch-up RIE may be performed to remove MG1 and MG2 from those regions and ensure electrical isolation of the gate electrode. The resulting structure following these steps is illustrated in FIGS. 15(a) and 15(b).

As then shown in FIGS. 16(a) and 16(b), conventional CMOS processing may then be employed to complete device/chip fabrication. For example, contact area (CA) formation includes another ILD oxide deposition followed by oxide CMP for planarization. The contact areas to the source, drain and gate terminals are defined by contact area lithography, followed by: contact area (via) oxide RIE down to S/D silicide regions 142 and gate metal 152, contact metal liner (e.g., TiN) deposition (not shown), contact metal (e.g., tungsten) fill 154, contact metal CMP and touch-up RIE. It will be noted at this point that the structures produced by both the first and second process embodiments begin to appear substantially similar to one another, as reflected in FIGS. 16(a) and 16(b).

Figure 17:
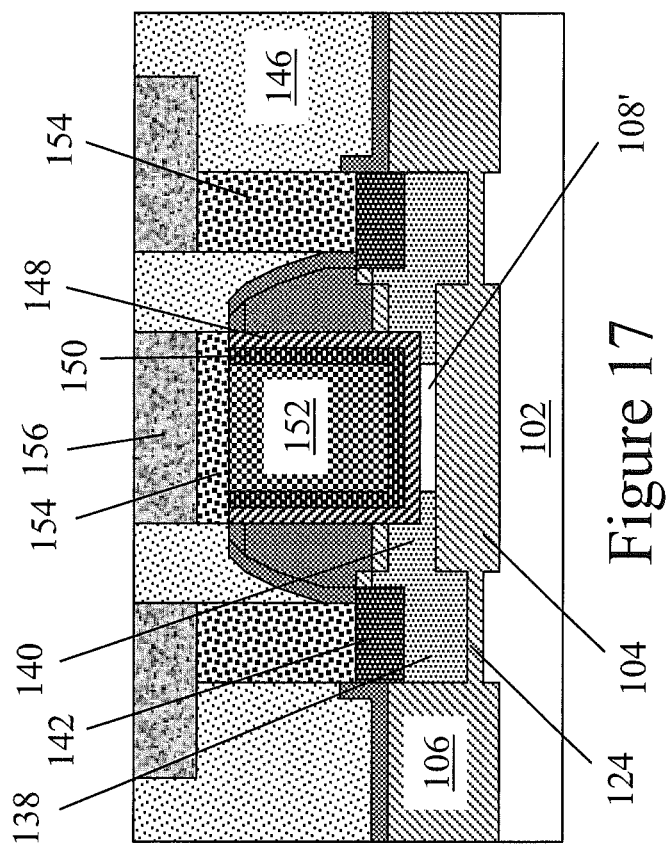
FIG. 17 illustrates formation of the first metal layer (M1) interconnects for either of the first or second embodiments.

Finally, FIG. 17 illustrates the formation of the first metal layer (M1) interconnects 156 using another ILD oxide deposition, interconnect metal (e.g., copper) deposition, and metal CMP. As both embodiments result in a substantially similar structure at this point, a single figure is used to illustrate M1 metal formation. Again, subsequent processing may be in accordance with existing back-end-of-line (BEOL) manufacturing techniques.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of forming a transistor device, the method comprising:
   forming a dummy gate stack structure over a silicon-on-insulator (SOI) starting substrate, the SOI starting substrate comprising a bulk layer, a global BOX layer over the bulk layer, and an SOI layer over the global BOX layer, the SOI layer having an initial thickness;
   forming self-aligned trenches completely through portions of the SOI layer and the global BOX layer at locations corresponding to source and drain regions;
   epitaxially regrowing silicon in the source and drain regions;
   re-establishing, by oxygen ion implantation, a local BOX layer in the epitaxially regrown silicon, adjacent to the global BOX layer, wherein a top surface of the local BOX layer is below a top surface of the global BOX layer, and wherein a bottom surface of the local BOX layer is above a bottom surface of the global BOX layer;
   forming embedded source and drain stressors in the source and drain regions, adjacent a portion of the SOI layer corresponding to a channel region;
   forming silicide contacts on the source and drain regions;
   removing the dummy gate stack structure; and
   forming a final gate stack structure.

2. The method of claim 1, wherein forming the silicide contacts results in forming silicide on the dummy gate stack structure prior to removal thereof.

3. The method of claim 2, wherein the dummy gate stack structure comprises a dummy oxide, a dummy polysilicon on the dummy oxide, a poly screen oxide on the dummy polysilicon, and a nitride on the poly screen oxide, wherein the nitride and poly screen oxide are removed prior to forming the silicide contacts.

4. The method of claim 1, further comprising preventing forming silicide on the dummy gate stack structure.

5. The method of claim 4, wherein the dummy gate stack structure comprises a dummy oxide, a dummy polysilicon on the dummy oxide, a poly oxide cap on the dummy polysilicon, and a nitride on the poly oxide cap, and wherein the poly oxide cap is formed at an initial thickness sufficient so as to remain on the dummy polysilicon prior to forming the silicide contacts.

6. The method of claim 1, further comprising thinning the SOI layer from the original thickness to a final thickness following the removal of the dummy gate stack structure and prior to forming the final gate stack structure.

7. The method of claim 6, wherein the original thickness of the SOI layer corresponds to an ultra thin SOI (UTSOI) layer having a thickness range on the order of about 10 nanometers (nm) to about 30 nm.

8. The method of claim 7, wherein the final thickness of the SOI layer corresponds to an extremely thin SOI (ETSOI) layer having a thickness range on the order of about 2 nm to about 10 nm.

9. The method of claim 1, wherein the transistor device is an n-type field effect transistor (NFET) and the embedded source and drain stressors are selected to provide a tensile stress on the channel region.

10. The method of claim 1, wherein the transistor device is a p-type field effect transistor (PFET) and the embedded source and drain stressors are selected to provide a compressive stress on the channel region.

11. A method of forming a transistor device, the method comprising:
   forming a dummy gate stack structure over a silicon-on-insulator (SOI) starting substrate, the SOI starting substrate comprising a bulk layer, a global BOX layer over the bulk layer, and an SOI layer over the global BOX layer, the SOI layer having an initial thickness;
   forming disposable spacers on sidewalls of the dummy gate stack structure;
   forming self-aligned trenches completely through portions of the SOI layer and the global BOX layer at locations corresponding to source and drain regions;
   epitaxially regrowing silicon in the source and drain regions;
   re-establishing a local BOX layer in the epitaxially regrown silicon, adjacent to the global BOX layer, wherein a top surface of the local BOX layer is below a top surface of the global BOX layer;
   forming embedded source and drain stressors in the source and drain regions, adjacent a portion of the SOI layer corresponding to a channel region;
   performing, with the disposable spacers in place, a first dopant implant to establish lightly doped source/drain regions;
   removing the disposable spacers and performing a second dopant implant to form source/drain extension regions;
   forming final sidewall spacers and performing a third dopant implant to establish deep source/drain regions, and annealing to drive the implanted dopant materials;
   forming silicide contacts on the source/drain regions;
   removing the dummy gate stack structure;
   thinning the SOI layer from the original thickness to a final thickness; and
   forming a final gate stack structure.

12. The method of claim 11, wherein forming the silicide contacts results in forming silicide on the dummy gate stack structure prior to removal thereof.

13. The method of claim 12, wherein the dummy gate stack structure comprises a dummy oxide, a dummy polysilicon on the dummy oxide, a poly screen oxide on the dummy polysilicon, and a nitride on the poly screen oxide, wherein the nitride and poly screen oxide are removed prior to forming the silicide contacts.

14. The method of claim 11, further comprising preventing forming silicide on the dummy gate stack structure.

15. The method of claim 14, wherein the dummy gate stack structure comprises a dummy oxide, a dummy polysilicon on the dummy oxide, a poly oxide cap on the dummy polysilicon, and a nitride on the poly oxide cap, and wherein the poly oxide cap is formed at an initial thickness sufficient so as to remain on the dummy polysilicon prior to forming the silicide contacts.

16. The method of claim 11, further comprising thinning the SOI layer from the original thickness to a final thickness following the removal of the dummy gate stack structure and prior to forming the final gate stack structure.

17. The method of claim 11, wherein the final gate stack structure comprises a high-k, metal gate stack structure.

18. The method of claim 17, wherein the final thickness of the SOI layer corresponds to an extremely thin SOI (ETSOI) layer having a thickness range on the order of about 2 nm to about 10 nm.

19. The method of claim 11, wherein the transistor device is an n-type field effect transistor (NFET) and the embedded source and drain stressors are selected to provide a tensile stress on the channel region.

20. The method of claim 11, wherein the transistor device is a p-type field effect transistor (PFET) and the embedded source and drain stressors are selected to provide a compressive stress on the channel region.

\* \* \* \* \*